(12) United States Patent
Lu

(10) Patent No.: US 7,808,795 B2
(45) Date of Patent: Oct. 5, 2010

(54) POSITIONING ASSEMBLY BETWEEN COMPUTER-RELATED ASSEMBLY AND HUB

(75) Inventor: Limo Lu, Taipei Hsien (TW)

(73) Assignee: Broadrack Technology Corp., Taipei Hsien (TW)

( * ) Notice: Subject to any disclaimer, the term of this patent is extended or adjusted under 35 U.S.C. 154(b) by 254 days.

(21) Appl. No.: 12/108,521

(22) Filed: Apr. 24, 2008

(65) Prior Publication Data

US 2009/0268413 A1    Oct. 29, 2009

(51) Int. Cl.
G06F 7/16 (2006.01)

(52) U.S. Cl. .................... 361/727; 312/223.1

(58) Field of Classification Search ............. 361/727
See application file for complete search history.

(56) References Cited

U.S. PATENT DOCUMENTS

| | | | | |
|---|---|---|---|---|
| 3,710,199 A * | 1/1973 | Cignoni, Jr. | | 361/727 |
| 4,614,383 A * | 9/1986 | Polley et al. | | 361/727 |
| 5,388,032 A * | 2/1995 | Gill et al. | | 361/727 |
| 5,726,866 A * | 3/1998 | Allen | | 361/727 |
| 6,297,962 B1 * | 10/2001 | Johnson et al. | | 361/726 |
| 6,442,030 B1 * | 8/2002 | Mammoser et al. | | 361/727 |
| 6,442,031 B1 * | 8/2002 | Liu | | 361/727 |
| 6,483,709 B1 * | 11/2002 | Layton | | 361/724 |
| 6,600,656 B1 * | 7/2003 | Mori et al. | | 361/724 |
| 6,719,149 B2 * | 4/2004 | Tomino | | 211/26 |
| 6,726,164 B1 * | 4/2004 | Baiza et al. | | 361/727 |
| 6,856,505 B1 * | 2/2005 | Venegas et al. | | 361/724 |
| 6,867,980 B2 * | 3/2005 | Wrycraft | | 361/727 |
| 6,924,989 B2 * | 8/2005 | Hall | | 361/727 |
| 7,187,554 B2 * | 3/2007 | Seki et al. | | 361/727 |
| 7,405,926 B2 * | 7/2008 | Wu et al. | | 361/727 |
| 7,633,760 B2 * | 12/2009 | Wu et al. | | 361/727 |
| 2006/0289370 A1 * | 12/2006 | Shih | | 211/26 |

* cited by examiner

Primary Examiner—Lisa Lea-Edmonds

(57) ABSTRACT

A positioning assembly between a computer-related assembly and a hub at a rear side of the computer-related assembly has a support arm connected between the computer-related assembly and the hub for receiving conductive wires; a positioning device at one surface of the computer-related assembly for combining the hub; two sliding tracks at two opposite lateral side of the computer-related assembly; the sliding track and sliding track being supported by four supporting posts which are formed as a supporting frame; the computer-related assembly being movable along the tracks from an outer side to an inner side; by the positioning device, the computer-related assembly being combinable with the hub. If an external force is applied to the computer-related assembly, the positioning device will release from the computer-related assembly.

4 Claims, 6 Drawing Sheets

POSITIONING ASSEMBLY BETWEEN COMPUTER-RELATED ASSEMBLY AND HUB

FIELD OF THE INVENTION

The present invention relates to positioning devices, and particularly to a positioning device of a computer-related assembly and a hub. A positioning device is installed between a computer-related assembly and a hub box so that they are combined temporarily. They are installed within the casing easily, conveniently and safely.

BACKGROUND OF THE INVENTION

Generally, an industrial computer is arranged in a casing as an array, including a computer unit 10, such as a mainframe or a hard disk array, etc., a hub 11 and a cured supporting frames 12 for supporting guiding wires; and two tracks 13, 14. The installation of the device includes the step of: (1) installing the two tracks 13, 14 in the front and rear posts in the casing; adjusting the positions of the ears for locking the hub 21; (2) pushing the hub 21 and computer unit 10 into the tracks 13, 14 sequentially; and leveling the ears and then locking the ears so that the ears are fixed to the rear predetermined positions of the tracks 13, 14; (3) pushing the hub 21, supporting arm 12 and the computer component 10 into the tracks 13, 14 sequentially; wherein the hub 21 is installed at rear ends of the tracks 13, 14 near the ears; the inner tracks of the computer unit 10 are engaged to the tracks 13, 14 so that it is slideable along the tracks 13, 14; then the locking the hub 21 to the ears so that the hub 21 is locked to the tracks 13, 14 and firmly secured thereto. Thus, the component unit 10 is movable along the tracks 13, 14 and the hub 21 is limited as it moves backwards.

In installing above mentioned structure, although the levels of the ears on the tracks 13, 14 have been got, the hub 21, supporting arm 12 and the computer unit 10 are individually components, which are connected by the supporting arm so that they are interacted with each other. Furthermore, because the computer unit 10 (for example a mainframe) is very expensive. If it is reinstalled, two peoples are necessary, wherein one takes the hub 21 and the other takes the computer unit 10. Then they are aligned to the two sides of the tracks 13, 14, and then are pushed into the tracks 13, 14. Therefore, it is tedious in installation. Besides, the computer unit 10 is freely movable along the tracks 13, 14, in installation, if the user is careless, such as after completing the operation, the computer unit 10 is not pushed back into the casing and is positioned therein, it is possible that the computer unit 10 will fall out. Thus, there is a demand for improving above mentioned defects.

SUMMARY OF THE INVENTION

Accordingly, the object of the present invention is to provide a positioning device of a computer-related assembly and a hub. A positioning device is installed between a computer-related assembly and a hub box so that they are combined temporarily. They are installed within the casing easily, conveniently and safely.

To achieve above object, the present invention provides a positioning assembly between a computer-related assembly and a hub at a rear side of the computer-related assembly; comprising: a support arm connected between the computer-related assembly and the hub for receiving conductive wires; a positioning device at one surface of the computer-related assembly for combining the hub; two sliding tracks at two opposite lateral side of the computer-related assembly; the sliding track and sliding track being supported by four supporting posts which is formed as a supporting frame; the computer-related assembly being movable along the tracks from an outer side to an inner side; by the positioning device, the computer-related assembly being combinable with the hub; wherein if an external force is applied to the computer-related assembly, the positioning device will release from the computer-related assembly.

The positioning device includes a first buckle at a rear side of the computer-related assembly and a second buckle at a front side of the hub and is corresponding to the first buckle. The first buckle is a hook and the second buckle is an embedding groove. The second buckle has an embedding groove which can be buckled with the first buckle; the embedding groove is formed by two blocks at two sides with a space being formed therebetween; each block is protruded with an ear at a side facing to another block, by the ears, the hook can be retained within the embedding groove.

The computer-related assembly includes a mainframe and a display. A surface at a rear side of the computer-related assembly has a recessed space for receiving the support arm.

By above structure, when the computer-related assembly (such as a mainframe or a hard disk array) is desired to be installed to a casing, the computer-related assembly can be combined with the hub temporary by the positioning device with a simple and convenient operation. They are pushed into the tracks and then the hub is locked to the rear ends of the tracks. Then the computer-related assembly also slide along the tracks. Besides, when the operation is complete, the mainframe is pushed to be buckled to the hub by a simple positioning way without falling out. Thus the assembly work is simple and convenient.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
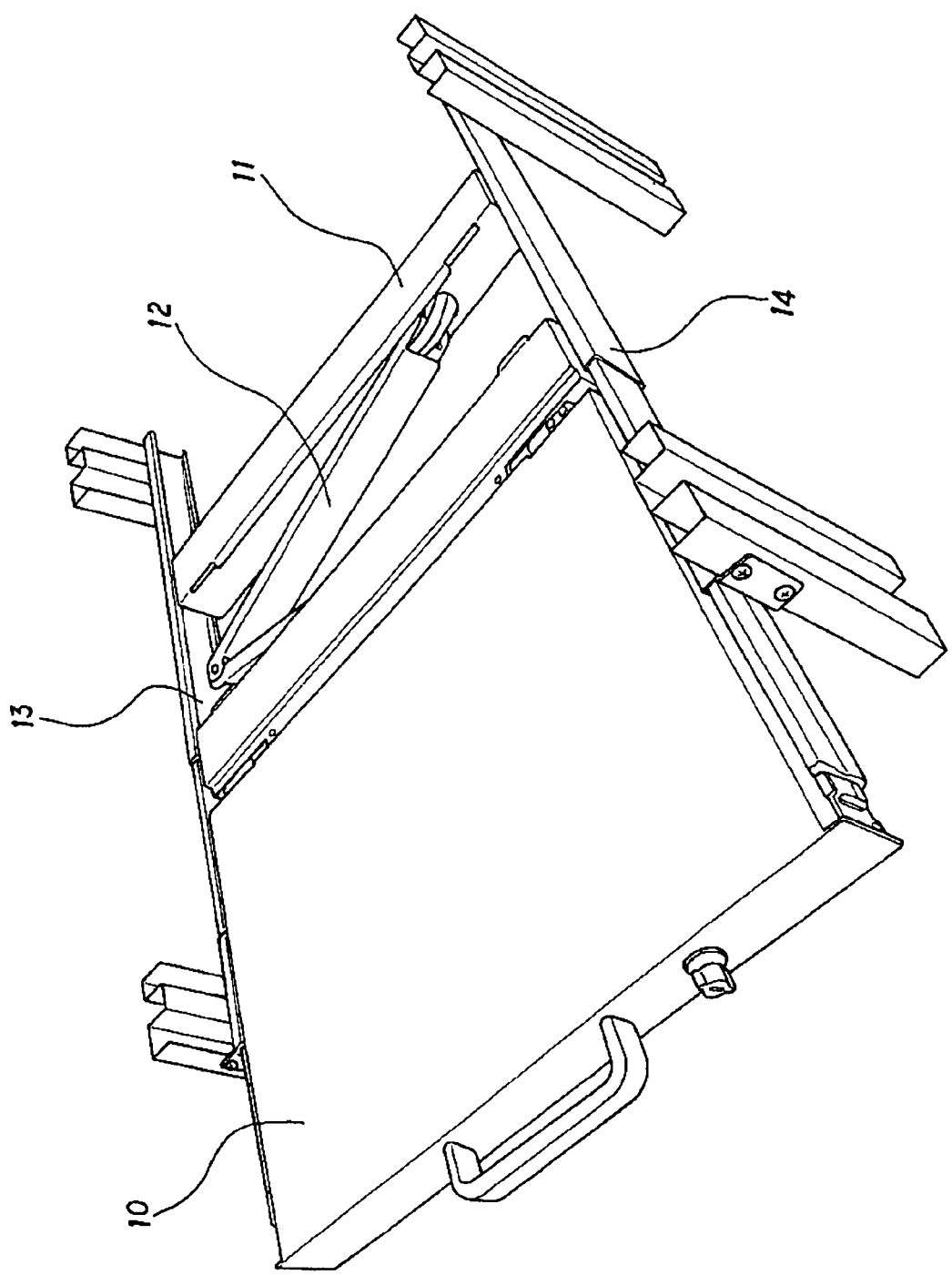
FIG. 1 is a schematic view showing the assembly of the computer unit in the prior art.
Figure 2:
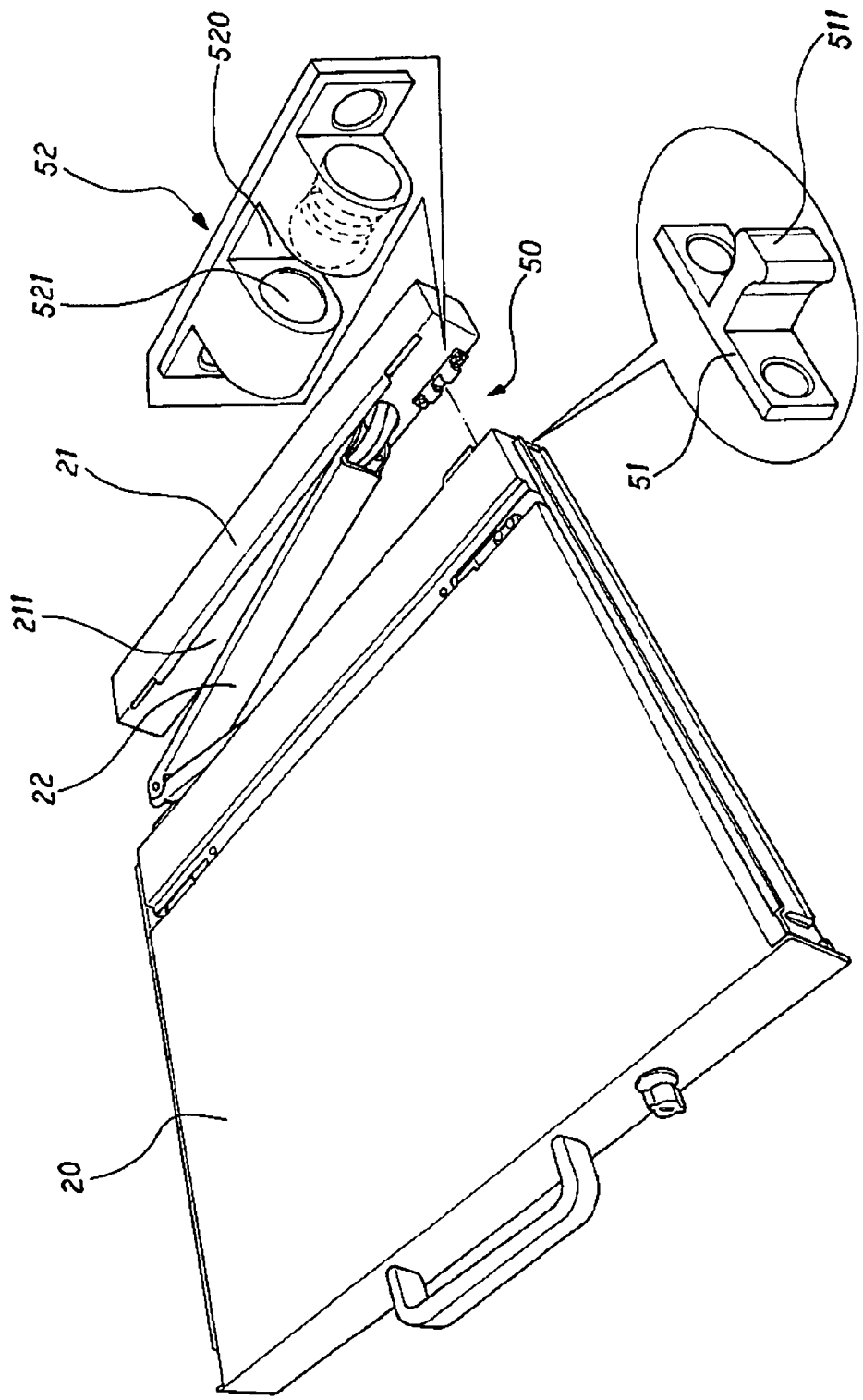
FIG. 2 is a perspective view showing the assembly of the present invention (the tracks are not illustrated).
Figure 3:
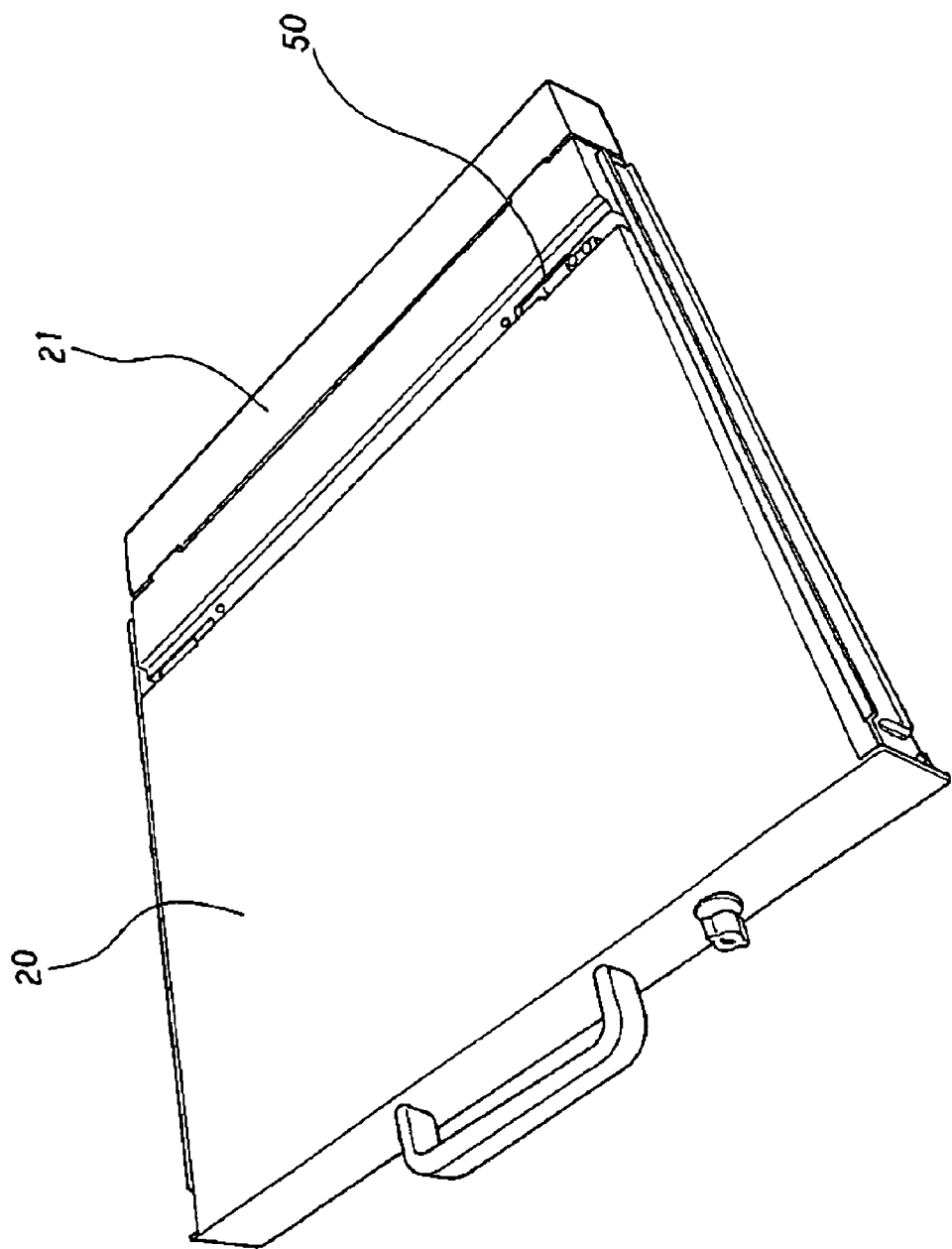
FIG. 3 is an assembled view of the present invention.

Referring to FIGS. 2 to 3, the positioning device for a computer-related assembly and a hub according to the present invention is illustrated.

A computer-related assembly 20 is included.

A hub 21 is positioned at a rear end of the computer-related assembly 20.

A support arm 22 is connected between the computer-related assembly 20 and the hub 21 for receiving conductive wires.

A surface at a rear side of the computer-related assembly 20 has a recessed space 211 for receiving the support arm 22. One surface of the computer-related assembly 20 for combining the hub 21 has a positioning device 50.

Figure 5:
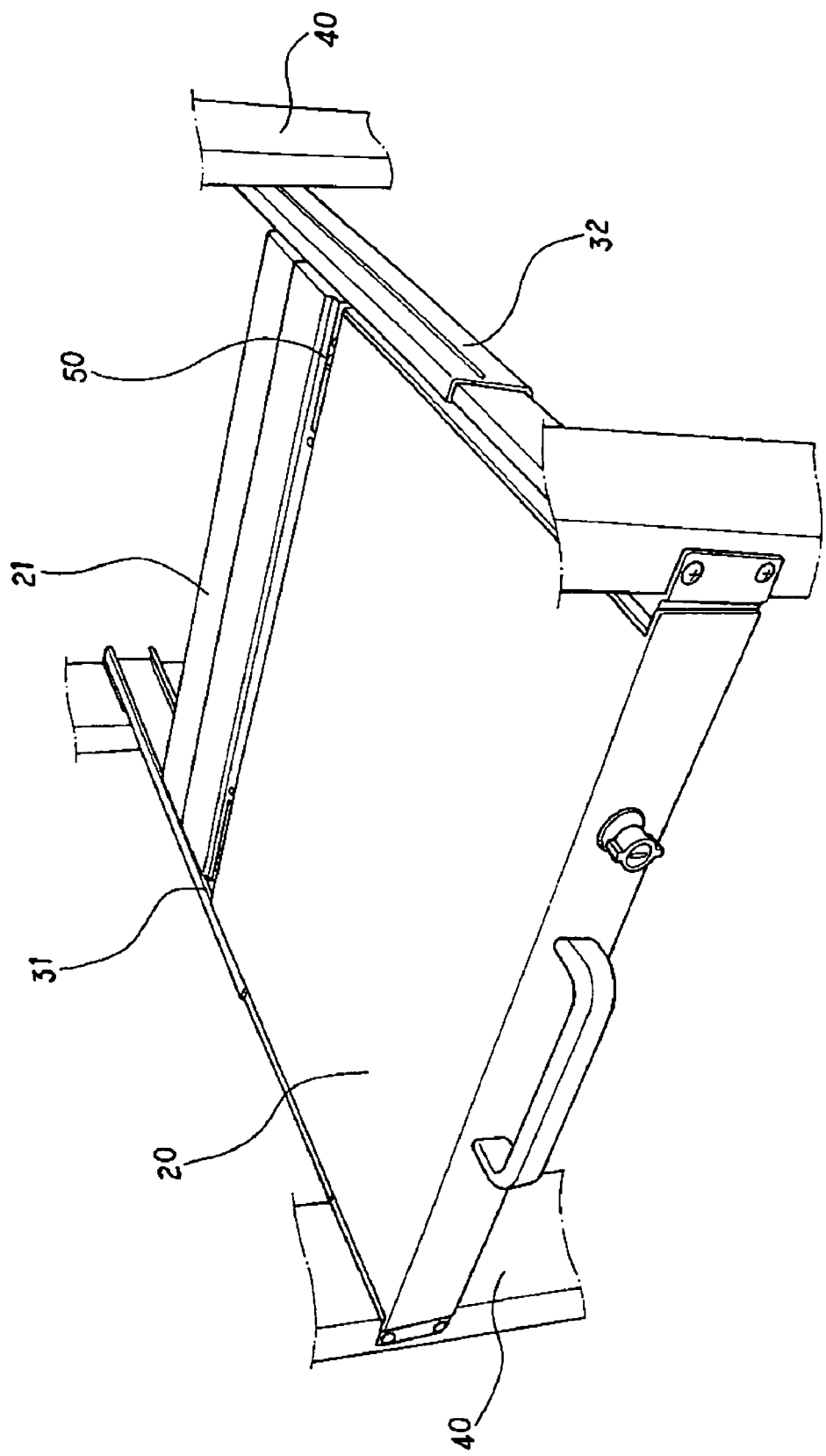
FIG. 5 is a schematic view showing that the present invention is installed in a casing.

Two sliding tracks 31, 32 at two opposite lateral side of the computer-related assembly 20 (referring to FIG. 5). The sliding track 31 and sliding track 32 are supported by four supporting posts 40 which are formed as a supporting frame. The computer-related assembly 20 is movable along the tracks 31, 32 from an outer side to an inner side. By the positioning device 50, the computer-related assembly 20 is combinable with the hub 21. Moreover, if an external force is applied to the computer-related assembly 20, the positioning device 50 will release from the computer-related assembly 20.

Figure 4:
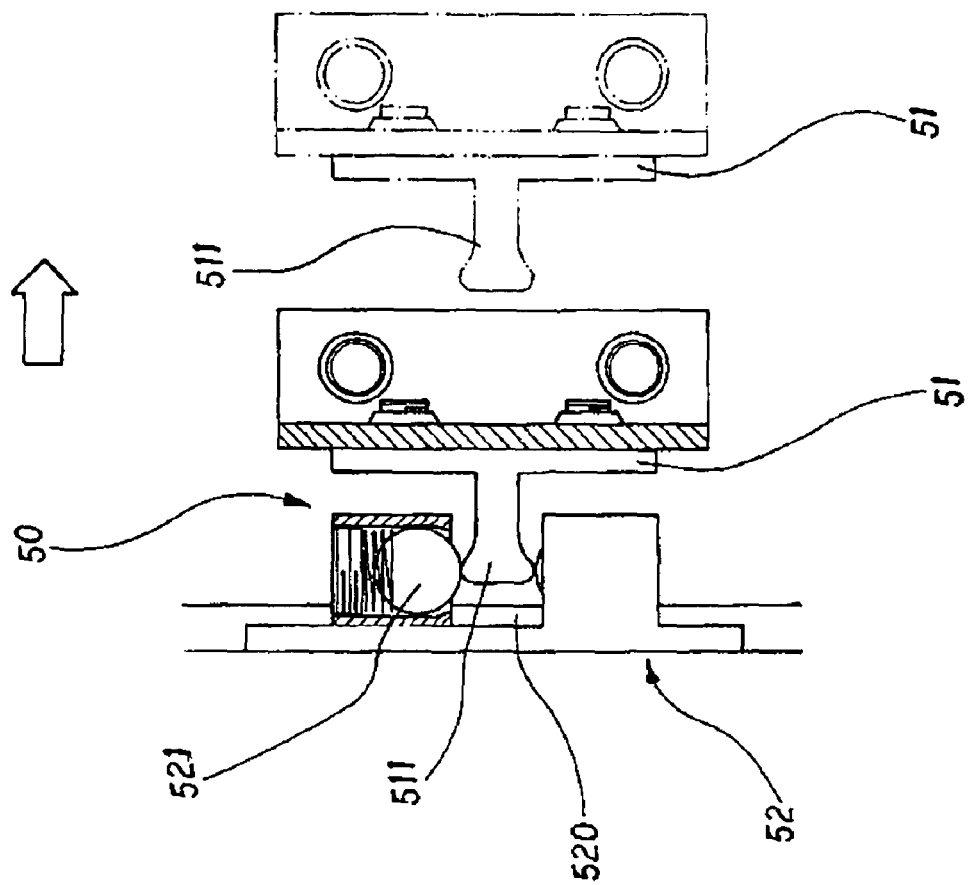
FIG. 4 is a schematic view showing the operation of retaining the positioning device of the present invention.
Figure 4:
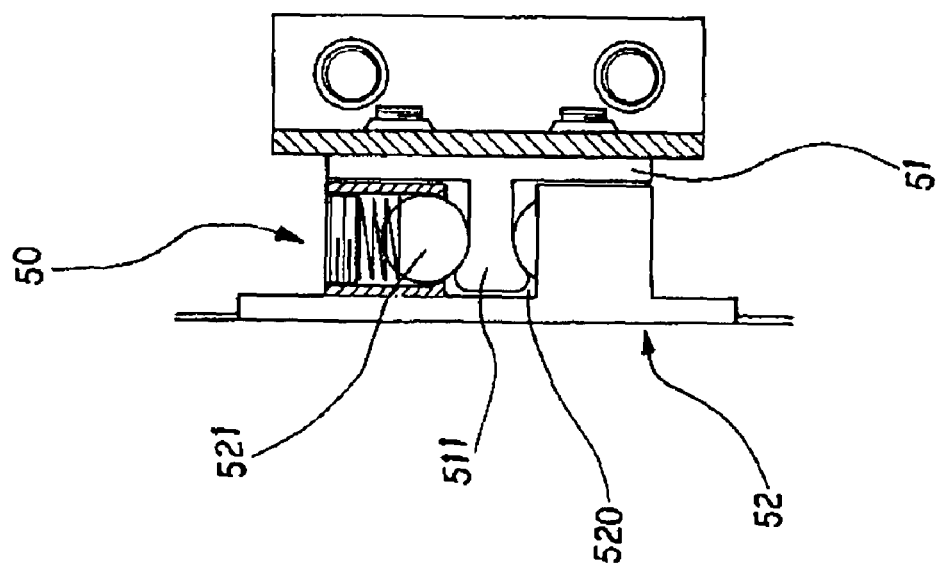

Referring to FIGS. 2 to 4, in this embodiment, the positioning device 50 has a first buckle 51 installed at the rear side of the computer-related assembly 20. In one example, the first buckle 51 has a hook 511 or has a ball like shape, etc. Besides, a front side of the hub 21 is installed with a second buckle 52 corresponding to the first buckle 51. The second buckle 52 has an embedding groove 520 which can be buckled with the first buckle 51. The embedding groove 520 is formed by two blocks at two sides with a space being formed therebetween. Each block is protruded with an ear 521 at a side facing to another block. By the ears 521, the hook 511 can be retained within the embedding groove 520.

Figure 6:
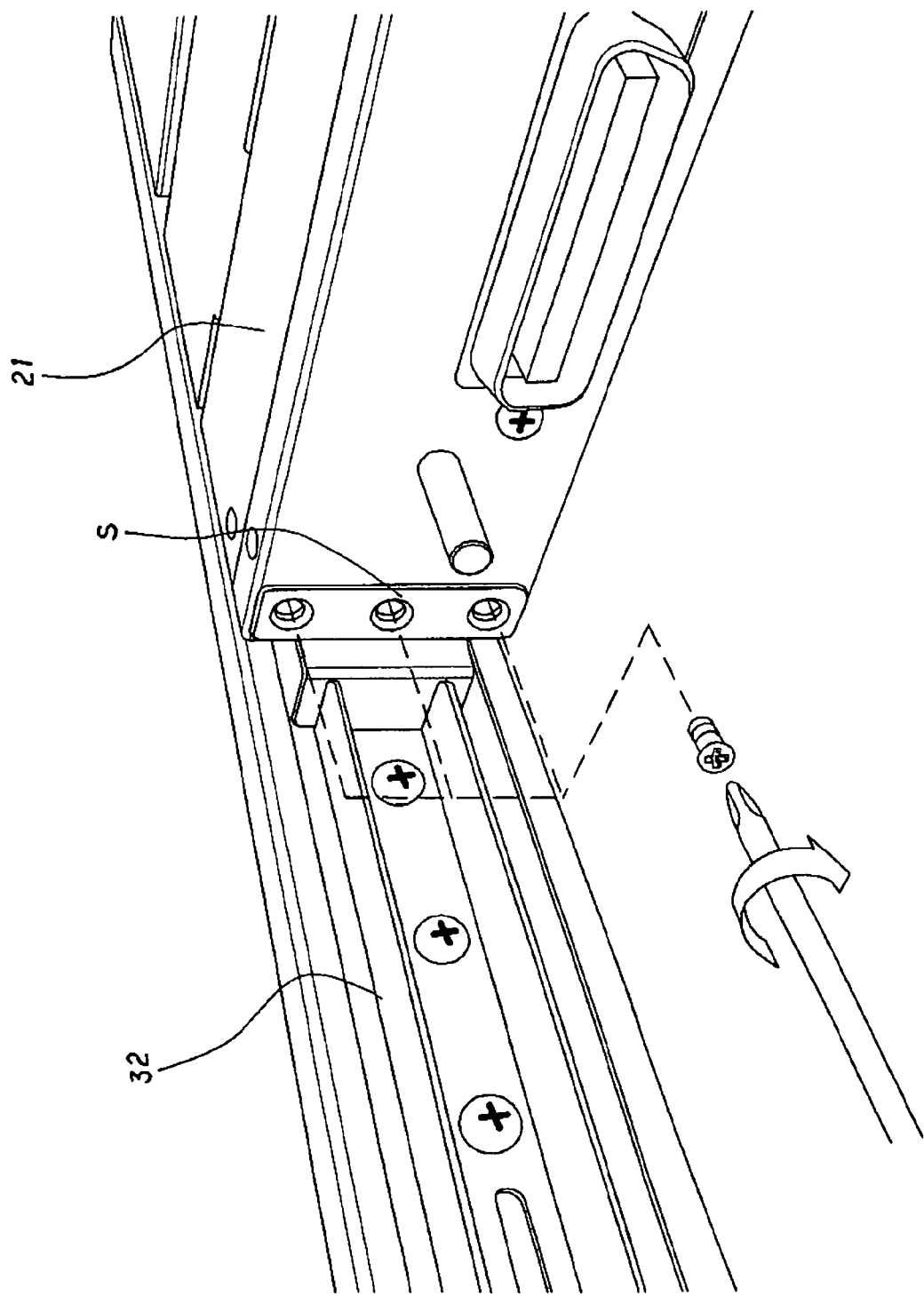
FIG. 6 is a schematic view showing that the hub of the present invention is locked to tracks.

By above mentioned structure, the computer-related assembly 20 is engaged to the hub 21 and the computer-related assembly 20 is pushed into the tracks, 31, 32 so that the hub 21 is locked to a fixing unit S at rear ends of the tracks 31, 32 so as to be positioned in the casing (referring to FIGS. 5, 6). The operation is convenient and easy. After operation, the computer-related assembly 20 can be pushed inwards to be engaged with the hub 21 without falling out. The operation is convenient and safe.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A positioning assembly between a computer-related assembly and a hub at a rear side of the computer-related assembly, comprising:
  a support arm connected between the computer-related assembly and the hub for receiving conductive wires;
  a positioning device at one surface of the computer-related assembly for combining the hub, wherein the positioning device includes a first buckle at a rear side of the computer-related assembly and a second buckle at a front side of the hub and is corresponding to the first buckle, the first buckle is a hook and the second buckle is an embedding groove; and
  two sliding tracks at two opposite lateral side of the computer-related assembly; the sliding tracks being supported by four supporting posts which are formed as a supporting frame; the computer-related assembly being movable along the tracks from an outer side to an inner side; by the positioning device, the computer-related assembly being combinable with the hub; wherein if an external force is applied to the computer-related assembly, the positioning device will release from the computer-related assembly.

2. The positioning assembly between a computer-related assembly and a hub as claimed in claim 1, wherein the second buckle has an embedding groove which can be buckled with the first buckle; the embedding groove is formed by two blocks at two sides with a space being formed therebetween; each block is protruded with an ear at a side facing to another block, by the ears, the hook can be retained within the embedding groove.

3. The positioning assembly between a computer-related assembly and a hub as claimed in claim 1, wherein the computer-related assembly includes a mainframe and a display.

4. The positioning assembly between a computer-related assembly and a hub as claimed in claim 1, wherein a surface at a rear side of the computer-related assembly has a recessed space for receiving the support arm.

* * * * *